United States Patent
Okabe

(10) Patent No.: US 11,776,593 B2
(45) Date of Patent: Oct. 3, 2023

(54) SEMICONDUCTOR DEVICE AND CONTINUOUS READING METHOD

(71) Applicant: Winbond Electronics Corp., Taichung (TW)

(72) Inventor: Sho Okabe, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/688,906

(22) Filed: Mar. 8, 2022

(65) Prior Publication Data

US 2022/0310138 A1 Sep. 29, 2022

(30) Foreign Application Priority Data

Mar. 29, 2021 (JP) ................. 2021-054637

(51) Int. Cl.
*G11C 7/10* (2006.01)
*G11C 7/12* (2006.01)
*G11C 7/20* (2006.01)

(52) U.S. Cl.
CPC .......... *G11C 7/1048* (2013.01); *G11C 7/106* (2013.01); *G11C 7/1069* (2013.01); *G11C 7/1087* (2013.01); *G11C 7/1096* (2013.01); *G11C 7/12* (2013.01); *G11C 7/20* (2013.01)

(58) Field of Classification Search
CPC ..... G11C 7/1048; G11C 7/106; G11C 7/1069; G11C 7/1087; G11C 7/1096; G11C 7/12; G11C 7/20
USPC ........................................................ 365/203
See application file for complete search history.

(56) References Cited

U.S. PATENT DOCUMENTS

| 7,652,941 | B2 | 1/2010 | Mori et al. |
| 2008/0175067 | A1* | 7/2008 | Tanaka ................ G11C 11/5642 365/185.25 |
| 2014/0078836 | A1 | 3/2014 | Ha |
| 2021/0035647 | A1 | 2/2021 | Senoo et al. |

FOREIGN PATENT DOCUMENTS

| CN | 104541329 | 4/2015 |
| CN | 102543153 | 3/2016 |
| JP | 2020074503 | 5/2020 |
| JP | 6744950 | 8/2020 |

(Continued)

OTHER PUBLICATIONS

"Office Action of Taiwan Counterpart Application", dated Mar. 22, 2022, p. 1-p. 5.

*Primary Examiner* — Huan Hoang
(74) *Attorney, Agent, or Firm* — JCIPRNET

(57) ABSTRACT

The invention provides a semiconductor device and a continuous reading method for suppressing fluctuations of a precharging voltage caused by an increase in a precharging time. The continuous reading method of a NAND flash memory of the invention includes the following steps: a first voltage (VCLMP1+Vth) is applied to a gate of a transistor (BLCLAMP) connected to a bit line and a voltage is supplied to the bit line via the transistor (BLCLAMP) to start precharging of the bit line; and a second voltage (VCLMP1+Vth−α) lower than the first voltage is applied to the gate of the transistor (BLCLAMP) when the precharging time caused by the application of the first voltage has elapsed for a certain period of time.

14 Claims, 9 Drawing Sheets

(56) References Cited

FOREIGN PATENT DOCUMENTS

| | | |
|---|---|---|
| TW | I489479 | 6/2015 |
| TW | I514390 | 12/2015 |
| TW | 202105393 | 2/2021 |

\* cited by examiner

SEMICONDUCTOR DEVICE AND CONTINUOUS READING METHOD

CROSS-REFERENCE TO RELATED APPLICATION

This application claims the priority benefit of Japan application serial no. 2021-054637, filed on Mar. 29, 2021. The entirety of the above-mentioned patent application is hereby incorporated by reference herein and made a part of this specification.

BACKGROUND

Technical Field

The invention relates to a semiconductor device and a continuous reading method, and particularly relates to a reading method for NAND flash memory.

Description of Related Art

A NAND flash memory is equipped with a continuous reading function (burst reading function) for continuously reading multiple pages in response to an external command. A page buffer/reading circuit includes, for example, two latches, and when a continuous reading operation is performed, as data read from an array is held in one of the latches, data held in the other latch may be output. Japan patent No. 6744950 discloses a continuous reading method implementing further high-speed continuous reading.

SUMMARY

FIG. 1 shows a schematic structure of a NAND flash memory equipped with an on-chip error checking and correction (ECC) function. The flash memory includes a memory cell array 10 including NAND strings, a page buffer/reading circuit 20, a data transfer circuit 30, a data transfer circuit 32, an error checking and correction circuit (which is referred to as an ECC circuit hereinafter) 40, and an input and output (I/O) circuit 50. The page buffer/reading circuit 20 includes two latches L1, L2 (one latch has, for example, 4 KB) for holding reading data or input data, and the latch L1 and the latch L2 respectively include a cache memory C0 and a cache memory C1 (one cache memory has, for example, 2 KB). The data transfer circuit 30 and the data transfer circuit 32 may perform bidirectional data transfer of the cache memory cells between the page buffer/reading circuit 20, the ECC circuit 40 and the I/O circuit 50.

FIG. 2 is a timing diagram of continuous reading of multiple pages as disclosed in Japan patent No. 6744950. Data of a page P0 read out from the memory cell array 10 is held in the cache memory C0 and the cache memory C1 (P0C0, P0C1) of the latch L1. Then, the data of the page P0 held in the latch L1 is transmitted to the cache memory C0 and the cache memory C1 of the latch L2. The ECC circuit 40 performs ECC decoding on the data of the cache memory C0 and the cache memory C1, and when an error is detected, the ECC circuit 40 corrects the data of the cache memory C0 and the cache memory C1 of the latch L2.

Data of a next page P1 is read out to the cache memory C0 and the cache memory C1 of the latch L1. During this period, the data of the cache memory C0 of the latch L2 is output through the I/O circuit 50 in synchronization with an external clock signal ExCLK. Then, data of the cache memory C1 of the latch L2 is output from the I/O circuit 50 in synchronization with the external clock signal ExCLK. During this period, the data of the page P1 of the cache memory C0 of the latch L1 is transferred to the latch L2, and the ECC circuit 40 performs ECC processing. Then, the data of the cache memory C1 of the latch L1 is transferred to the latch L2, and during a period that the data of the cache memory C0 of the latch L2 is output from the I/O circuit 50, ECC processing is performed on the data of the cache memory C1 of the latch L2. Then, during a period that the data of the cache memory C1 of the latch L2 is output from the I/O circuit 50, data of a next page P2 is read out to the cache memory C0 and the cache memory C1 of the latch L1, and the data of the cache memory C0 is transferred to the latch L2 to carry on the ECC processing.

FIG. 3A is an operation flow of normal page reading of a NAND flash memory. When a reading operation is started, first, the latch L1 is reset before precharging a bit line (S10). The reset of the latch L1 is used to accurately receive a charge from a reading node. Then, precharging of the bit line is started (S12). The precharging of the bit line is performed by supplying a voltage to a clamping transistor. A voltage VCLMP1+Vth (Vth is a threshold value of the transistor) is applied to a gate of the clamping transistor, and a voltage VCLMP1 is supplied to the bit line. The clamping transistor is turned on during a precharging time $T_{PR}$, and is then turned off (S14). After the precharging of the bit line, the NAND string is discharged for sensing a selected memory cell (S16), and then the charge of the reading node is transferred to the latch L1 (S18).

In Japan patent No. 6744950, in order to maximize a frequency of the external clock signal ExCLK to realize high-speed reading, a reading start timing of the array is not changed to the end of data transfer from the latch L1 to the latch L2, but changed to an earlier time point when the data of the cache memory C0 of the latch L1 is transferred to the latch L2. However, if the reading start timing of the array is earlier, there is a possibility that the time required for resetting the latch L1 cannot be sufficiently ensured. Therefore, a method of resetting the latch L1 after precharging of the bit line is disclosed in a previous application (Japan patent application No. 2020-074503). The operation flow is shown in FIG. 3B. The precharging of the bit line is started (S20), and the precharging is completed after waiting for the precharging time $T_{PR}$ (S22). Thereafter, the latch L1 is reset (S24), the NAND string is discharged (S26), and the charge of the reading node is transferred to the latch L1 (S28).

In continuous reading, if a frequency of the external clock signal ExCLK is less than a lower limit value, the precharging time $T_{PR}$ is longer than a determined time, and a precharging voltage of the bit line is higher than a designed optimal level, so that there is a risk of error judgment of the reading data.

FIG. 4A is a timing diagram of continuous reading at a high frequency, and FIG. 4B is a timing diagram of continuous reading at a low frequency. In the figures, "Precharging" represents precharging of a selected bit line GBL (for example, an even bit line), "L1 SET L" represents initialization of the latch L1, "Discharging" represents a sequence of turning on a source line side selection transistor to connect the NAND string to a source line, applying a reading voltage to a selected memory cell, and applying a reading pass voltage to non-selected memory cells, "SNS to L1" represents that the charge of the reading node is transferred to the latch L1. $T_{PR\_NORMAL}$ is a precharging time of normal reading or continuous reading at the high frequency, $T_{PR\_ADD}$ is an additional precharging time of the continuous reading at the low frequency, and Top is an operation time.

FIG. 5A is a waveform of the precharging voltage. A vertical axis represents voltage and a horizontal axis represents time. As shown in FIG. 5A, when the voltage VCLMP1 is supplied to the bit line, a certain amount of time is required for the precharging voltage of the bit line to be saturated and become constant. A reason thereof is that an amount of current supplied from the clamping transistor to the bit line is small relative to a capacitance of the bit line. Therefore, the level of the precharging voltage of the bit line is set by specifying the precharging time.

FIG. 5B is an enlarged view of FIG. 5A. The precharging voltage at the end of a normal precharging time $T_{PR\_NORMAL}$ is $V_{PR\_NORMAL}$, and the precharging voltage $V_{PR\_NORMAL}$ is a pre-designed optimal voltage. On the other hand, when reading is performed at a low frequency as that shown in FIG. 4B, a precharging time $T_{PR\_NORMAL}+T_{PR\_ADD}$ is longer than the normal precharging time $T_{PR\_NORMAL}$, and the precharging voltage at this moment is $V_{PR\_ADD}$, and $T_{PR\_NORMAL}<V_{PR\_ADD}$. If the precharging voltage $V_{PR\_ADD}$ is greater than the optimal precharging voltage $V_{PR\_NORMAL}$ by more than necessary, even if the selected memory cell is turned on during the discharging of the NAND string, a potential of the bit line will not be sufficiently decreased, and a larger charge than assumed is held at the reading node, so that there is a possibility of error judgement of the reading data in the latch L1.

In addition to the above-described continuous reading, exceeding and prolonging of the precharging time $T_{PR\_NORMAL}$ of the bit line may also occur during normal page reading as shown in FIG. 3A. For example, when the precharging voltage of the bit line is measured in operation analysis of the flash memory, if the reading sequence is temporarily stopped, the turn-on state of the clamping transistor continues, and as a result, the precharging voltage of the bit line is increased. Therefore, the measured precharging voltage and the actual precharging voltage have a difference there between, and accurate operation analysis cannot be performed.

In order to resolve the above existing problems, the invention is directed to a semiconductor device and a continuous reading method adapted to suppress fluctuations of a precharging voltage caused by increase of a precharging time.

The continuous reading method of NAND flash memory of the invention includes the following steps: a first voltage is applied to a gate of a transistor connected to a bit line, and a voltage is supplied to the bit line via transistor to start precharging the bit line; and a second voltage lower than the first voltage is applied to the gate of the transistor when the precharging time caused by application of the first voltage has elapsed for a certain period of time.

In an embodiment of the invention, the second voltage is a voltage level that limits a voltage precharged to the bit line to a certain range. In an embodiment of the invention, the second voltage is a voltage level that prevents the precharged bit line from becoming a floating state. In an embodiment of the invention, the certain period of time is less than the precharging time, and an optimal precharging voltage designed in the bit line is generated through supplying the first voltage during the precharging time. In an embodiment of the invention, the step of applying the second voltage includes applying the second voltage when a latch circuit receiving a charge of a reading node is unable to be initialized. In an embodiment of the invention, the step of applying the second voltage continues until the latch circuit is able to be initialized. In an embodiment of the invention, the certain period of time is determined based on time required to determine whether the latch circuit is able to be initialized. In an embodiment of the invention, the continuous reading method further includes a step of initializing the latch circuit after precharging the bit line. In one embodiment of the invention, each step is carried out in continuous reading of pages. In one embodiment of the invention, the continuous reading of pages includes: holding data read from a selected page of the memory cell array in the latch circuit, and holding data read from a next selected page in the latch circuit after transferring the data held in the latch circuit to other latch circuits; continuously outputting the data held in the other latch circuits to the outside in synchronization with an external clock signal; and performing error checking and correction on the data held in the other latch circuits.

The invention provides a semiconductor device including a NAND memory cell array; a reading unit that reads data from a selected page of the memory cell array; and an output unit that outputs the data read out by the reading unit to the outside. The reading unit includes a page buffer/reading circuit connected to the memory cell array via a bit line, the page buffer/reading circuit includes a transistor for supplying a precharging voltage to the bit line, when precharging the bit line, the page buffer/reading circuit applies a first voltage to a gate of the transistor to start to precharge, and applies a second voltage less than the first voltage to the gate of the transistor when a precharging time has elapsed for a certain period of time.

In an embodiment of the invention, the second voltage is a voltage level that limits a voltage precharged to the bit line to a certain range. In an embodiment of the invention, the second voltage is a voltage level that prevents the precharged bit line from becoming a floating state. In an embodiment of the invention, the certain period of time is less than the precharging time, and, an optimal precharging voltage designed in the bit line is generated through supplying the first voltage during the precharging time. In an embodiment of the invention, the page buffer/reading circuit applies the second voltage when a latch circuit receiving a charge of a reading node is unable to be initialized, and the applying the second voltage continues until the latch circuit is able to be initialized. In an embodiment of the invention, the certain period of time is determined based on time required to determine whether the latch circuit is able to be initialized. In an embodiment of the invention, the reading unit further initializes the latch circuit after precharging the bit line. In one embodiment of the invention, the reading unit performs continuous reading of pages. In one embodiment of the invention, the page buffer/reading circuit further includes other latch circuits that receive data held in the latch circuit, and when the reading unit performs continuous reading, the latch circuit holds data read from a next selected page of the memory cell array during a period when the data of the other latch circuits is output. In one embodiment of the invention, the semiconductor device further includes an ECC circuit that performs error checking and correction of data, and when the reading unit performs continuous reading, during a period when the data held in a first part of the other latch circuits is subjected to an ECC process performed by the ECC circuit, the data undergoing the ECC process and held in a second part of the other latch circuits is output.

According to the invention, when the precharging time of the bit line has elapsed for a certain period of time, a gate voltage of the transistor supplying a voltage to the bit line is decreased, so even if the precharging time becomes longer, the precharging voltage of the bit line may be limited within a certain range to prevent determining the reading data incorrectly.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Embodiments of the invention will be described in detail with reference to the accompanying drawings.

Figure 6:
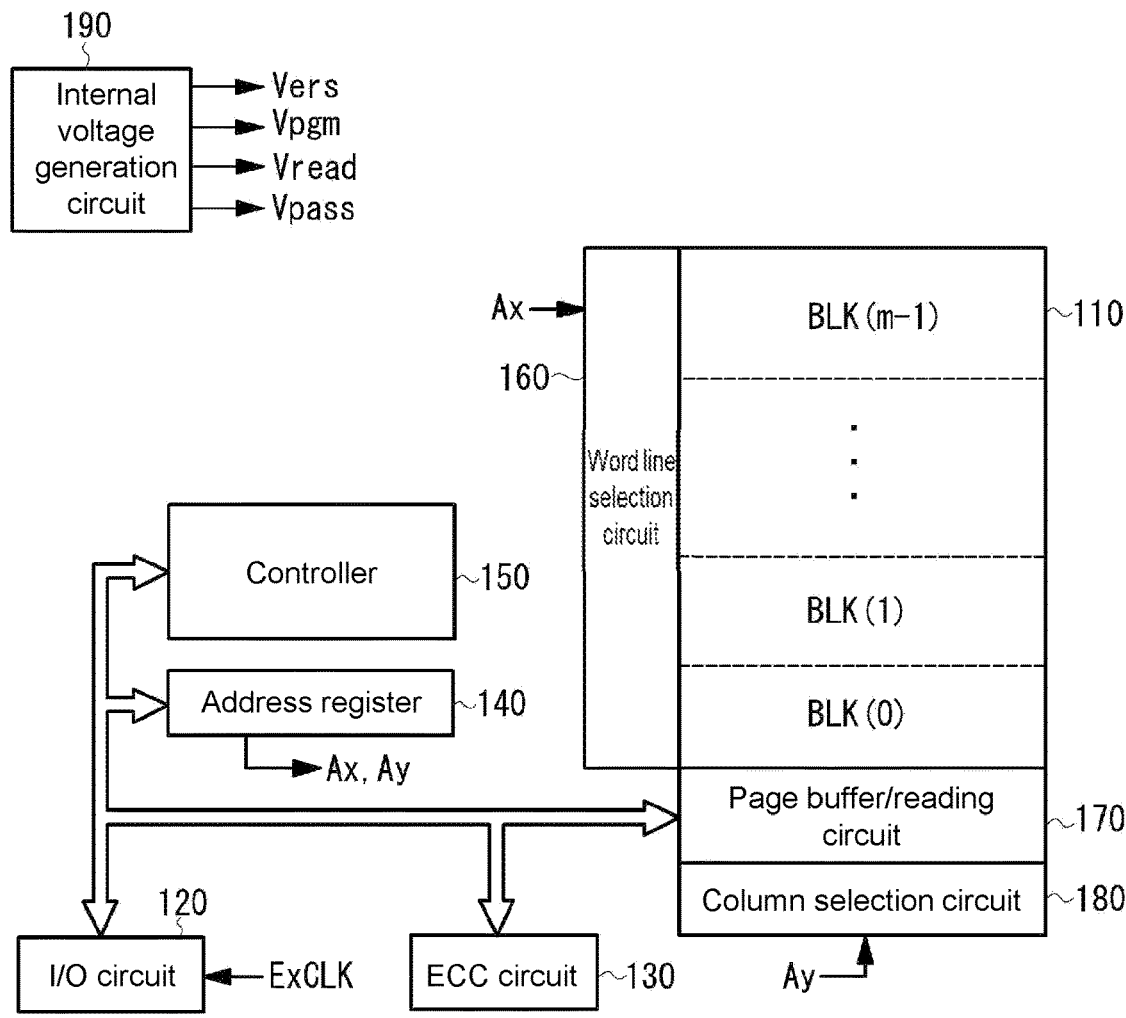
FIG. 6 is a block diagram of a structure of a NAND flash memory according to an embodiment of the invention.

FIG. 6 is a diagram illustrating a structure of a NAND flash memory according to an embodiment of the invention. A flash memory 100 of the embodiment includes following components: a memory cell array 110, which has a plurality of memory cells arranged in a matrix; an input/output (I/O) circuit 120, which is connected to an external input/output terminal, and outputs read data to the outside in response to an external clock signal ExCLK, or receives data input from the outside; an ECC circuit 130, which performs symbol generation of data to be programmed or error checking and correction of read data; an address register 140, which receives address data via the I/O circuit 120; a controller 150, which controls each part based on command data received via the I/O circuit 120 or control signals applied to terminals; a word line selection circuit 160, which receives a row address information Ax from the address register 140, decodes the row address information Ax, and selects a block or a word line based on a decoding result, etc; a page buffer/reading circuit 170, which holds data read from a page selected by the word line selection circuit 160, or data to be programmed into the selected page; a column selection circuit 180, which receives column address information Ay from the address register 140, decodes the column address information Ay, and selects a column in the page buffer/reading circuit 170 based on a decoding result, etc. and an internal voltage generation circuit 190, which generates various voltages (a programming voltage Vpgm, a pass voltage Vpass, a reading pass voltage Vread, an erasing voltage Vers, etc.) required for reading, programming and erasing of data.

The memory cell array 110 has, for example, m memory blocks BLK(0), BLK(1), . . . BLK(m−1) arranged in a column direction, a plurality of NAND strings are formed in one memory block, and the NAND string is formed by connecting a plurality of memory cells in series. One NAND string includes a plurality of memory cells connected in series, a bit line side selection transistor, and a source line side selection transistor. A drain of the bit line side selection transistor is connected to a corresponding bit line, and a source of the source line side selection transistor is connected to a common source line. A control gate of the memory cell are connected to the word line, and gates of the bit line side selection transistor and the source line side selection transistor are respectively connected to a selection gate line. The word line selection circuit 160 drives the bit line side selection transistors and the source line side selection transistors through the selection gate line based on the row address information Ax to select a block or a word. The NAND strings may be formed on a substrate surface either in a two-dimensional manner or a three-dimensional manner. In addition, the memory cell may be either a single level cell (SLC) that stores one bit (binary data), or a multi level cell (MLC) that stores multiple bits.

Figure 7:
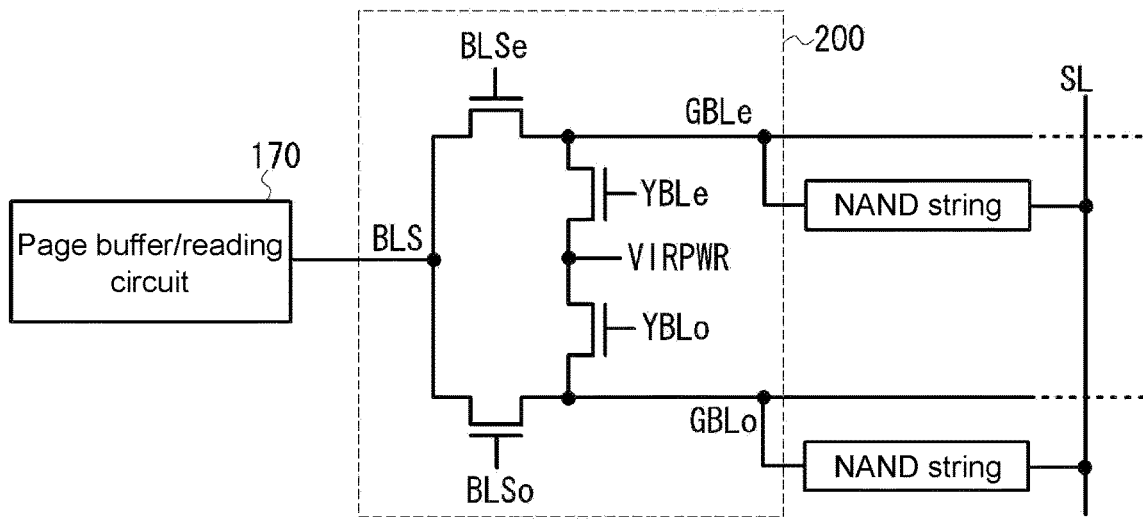
FIG. 7 is a structural diagram of a bit line selection circuit of the flash memory according to an embodiment of the invention.

FIG. 7 is a structure of a bit line selection circuit. FIG. 7 illustrates a bit line selection circuit 200, and the bit line selection circuit 200 is connected to a page buffer/reading circuit 170 shared by an even bit line GBLe and an odd bit line GBLo. The bit line selection circuit 200 includes: a transistor BLSe for selecting the even bit line GBLe, a transistor BLSo for selecting the odd bit line GBLo, a transistor YBLe for connecting a virtual power supply VIRPWR to the even bit line GBLe, and a transistor YBLo for connecting the virtual power supply VIRPWR to the odd bit line GBLo. A NAND string is connected between the even bit line GBLe and a source line SL, and a NAND string is connected between the odd bit line GBLo and the source line SL. For example, in a reading operation, when the even bit line GBLe is selected, the odd bit line GBLo is not selected, and when the odd bit line GBLo is selected, the even bit line GBLe is not selected. The unselected bit line is connected to a ground level (GND) via the virtual power supply VIRPWR.

Figure 8:
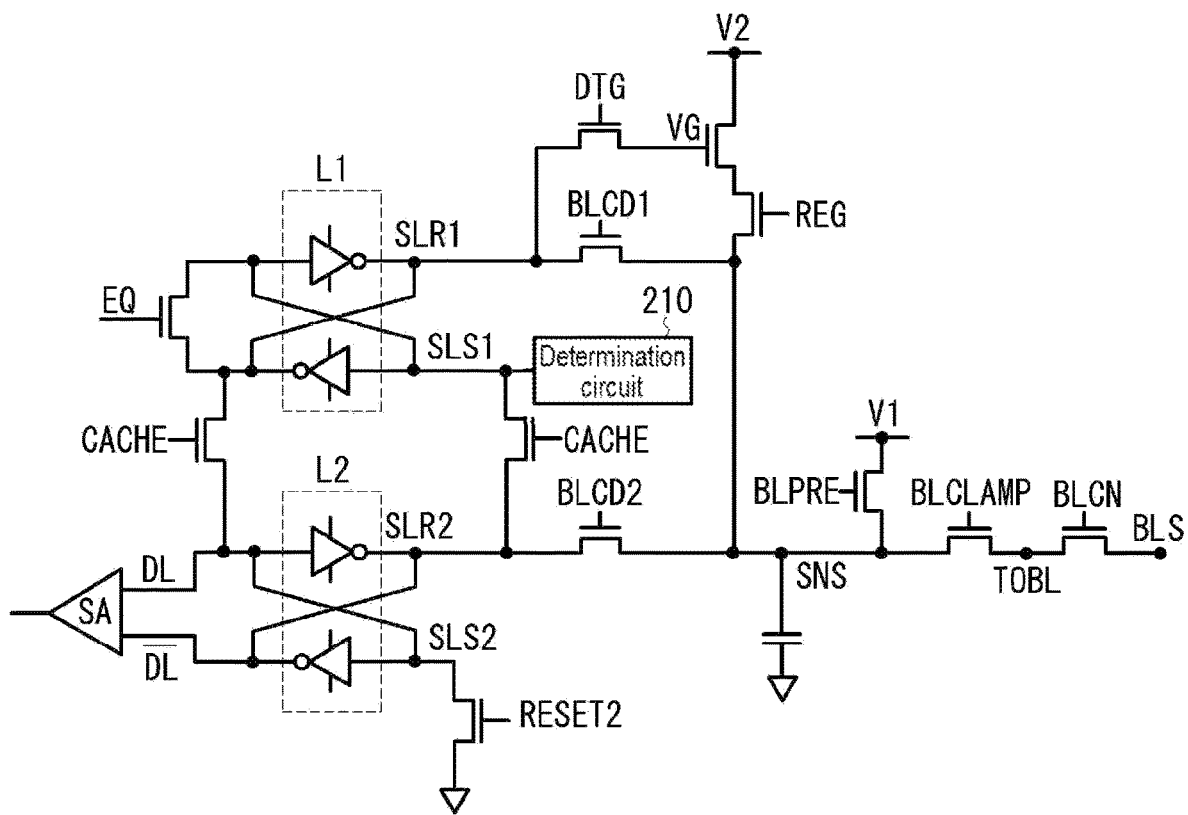
FIG. 8 is a structural diagram of a page buffer/reading circuit of the flash memory according to an embodiment of the invention.

FIG. 8 illustrates a structure of the page buffer/reading circuit 170. FIG. 8 illustrates a page buffer/reading circuit. For convenience's sake, the signal applied to a gate of a transistor is assumed to represent the transistor. The page buffer/reading circuit 170 includes two latches L1, L2, a transfer gate (a transistor CACHE) is connected between the latch L1 and the latch L2, and bidirectional data transfer from the latch L1 to the latch L2 or from the latch L2 to the latch L1 may be performed by turning on the transfer gate.

A node SLR1 of the latch L1 is connected to a common source/drain (S/D) of a transistor BLCD1 and a transistor DTG, and a node SLS1 is connected to a determination circuit 210. The determination circuit 210 determines, for example, whether programming verification or erasing verification is eligible. When a voltage supply node V2 selectively charges the node SLR1 to Vdd or selectively discharges the node SLR1 to GND in the programming verification, etc., the transistor DTG is turned on. Furthermore, the latch L1 may implement a short circuit of the node SLR1 and the node SLS1 through a transistor EQ.

The node SLR1 and the node SLS1 of the latch L1 are respectively connected to a node SLS2 and a node SLR2 of the latch L2 via the transistor CACHE. The node SLR2 of the latch L2 is connected to a reading node SNS via the transistor BLCD2, and the node SLS2 is connected to a transistor RESET2. When the latch L2 is reset, the transistor RESET2 is turned on. In addition, the node SLS2 and the node SLR2 are connected to a differential reading amplifier SA through a data line DL and a data line /DL, and an output of the differential reading amplifier SA is connected to the I/O circuit 120.

A transistor VG and a transistor REG are connected in series between the voltage supply node V2 and the reading node SNS, and a gate of the transistor VG is connected to a source/drain of the transistor DTG. A voltage supply node V1 is connected to the reading node SNS through a transistor BLPRE. The voltage supply node V1 supplies an internal supply voltage Vdd when the bit line is precharged, and supplies a GND potential when the latch L1 is reset. A transistor BLCN and a transistor BLCLAMP are connected in series between the reading node SNS and a node BLS of the bit line selection circuit 200.

The word line selection circuit 160 and the column selection circuit 180 select a reading start position of data in the page according to the row address information Ax and the column address information Ay, or automatically read data from the beginning of the page without using the row address and the column address. Further, the word line selection circuit 160 and the column selection circuit 180 may include a row address counter and a column address counter that progressively increase the row address and the column address in response to a clock signal.

In a reading operation of the flash memory, a certain positive voltage is applied to the bit line, a certain voltage (for example, 0 V) is applied to the selected word line, and a pass voltage Vpass (for example, 4.5 V) is applied to the unselected word lines to turn on the bit line side selection transistor and the source line side selection transistor, and 0 V is applied to the common source line. In a programming operation, a high-voltage programming voltage Vpgm (15-20 V) is applied to the selected word line, and an intermediate potential (for example, 10 V) is applied to the unselected word lines, so that the bit line side selection transistor is turned on, and the source line side selection transistor is turned on to supply a potential corresponding to data of "0" or "1" to the bit line. In an erasing operation, 0 V is applied to the selected word line in the block, a high voltage (for example, 20 V) is applied to a P-well to erase data block by block by extracting electrons of a floating gate to a substrate.

Figure 9:
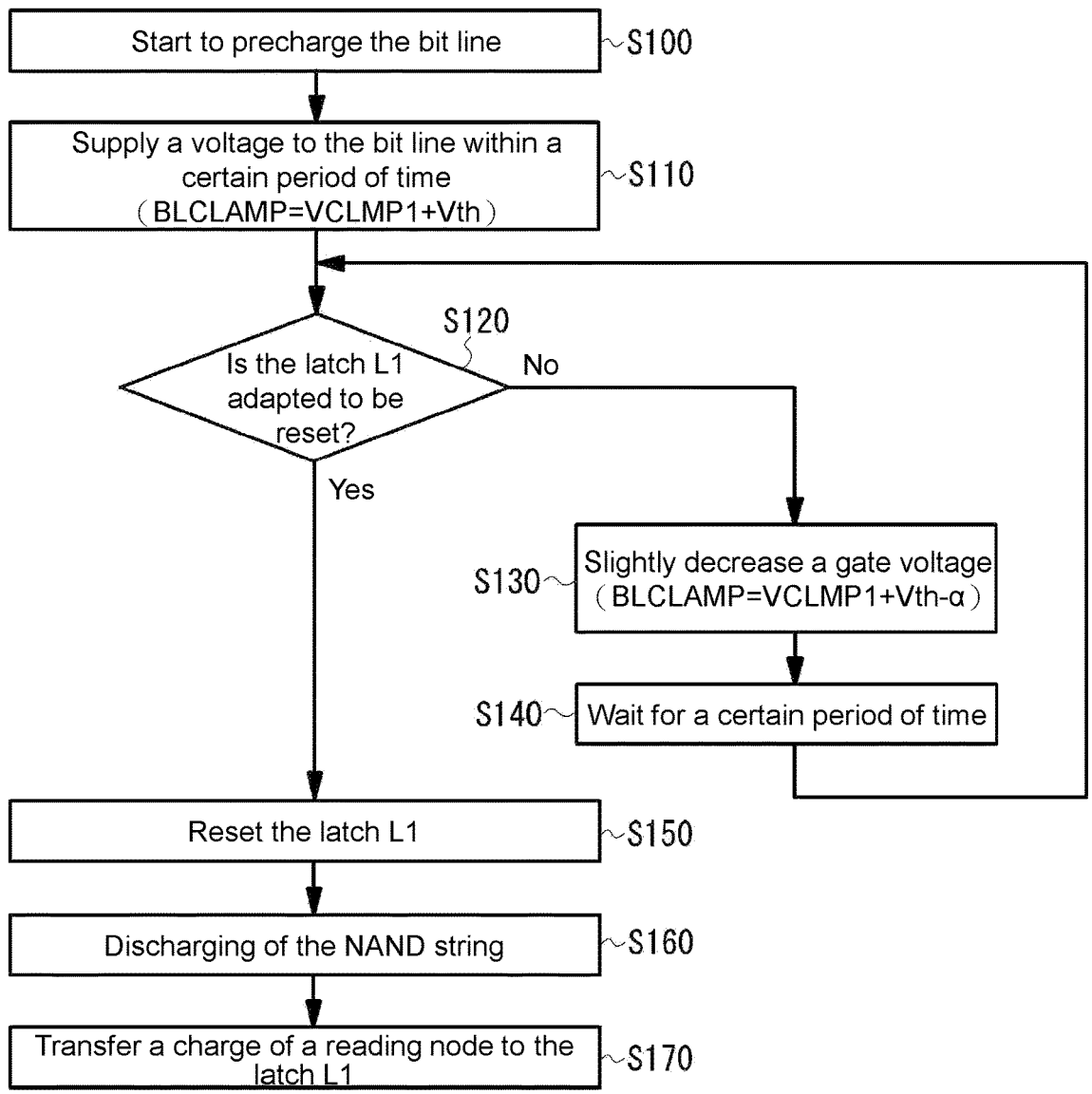
FIG. 9 is a flowchart of a precharging operation of a bit line according to an embodiment of the invention.

Then, a precharging operation of the bit lines of the flash memory 100 of the embodiment is described below. FIG. 9 is a flowchart of a precharging operation when the latch L1 is reset after the precharging. For example, when array reading of a next page is performed in the continuous reading operation of pages, the controller 150 first starts precharging the bit lines via the page buffer/reading circuit 170 (S100).

The controller 150 switches the voltage supply node V1 to the supply voltage Vdd to turn on the transistor BLPRE, so as to charge the reading node SNS to a level of Vdd. Then, a voltage VCLMP1+Vth (Vth is a threshold value of the transistor BLCLAMP) is applied to the gate of a transistor BLCLAMP, and the voltage VCLMP1 is charged to the node TOBL. Electrical connection between the node TOBL and the node BLS is implemented through the transistor BLCN. The supply voltage Vdd is applied to a gate of the transistor BLCN to turn on the transistor BLCN, so as to charge the node BLS to the voltage VCLMP1. Furthermore, it is in a relationship of supply voltage Vdd≥VCLMP1. In addition, the transistor BLCD1, the transistor BLCD2, and the transistor REG are not turned on.

The controller 150 further precharges the selected bit line via the bit line selection circuit 200. It is assumed that the even bit line GBLe is selected, the transistor BLSe is turned on, and the node BLS is electrically connected to the even bit line GBLe. Moreover, the bit line side selection transistor of the NAND string connected to the even bit line GBLe is turned on, and the source line side selection transistor is turned off to apply a pass voltage to the selected page and the unselected pages. Thereby, the voltage VCLMP1 is supplied to the even bit line GBLe (S110). On the other hand, the non-selected odd bit line GBLo is electrically connected to the GND of the virtual power supply VIRPWR through the transistor YBLo.

Figure 1:
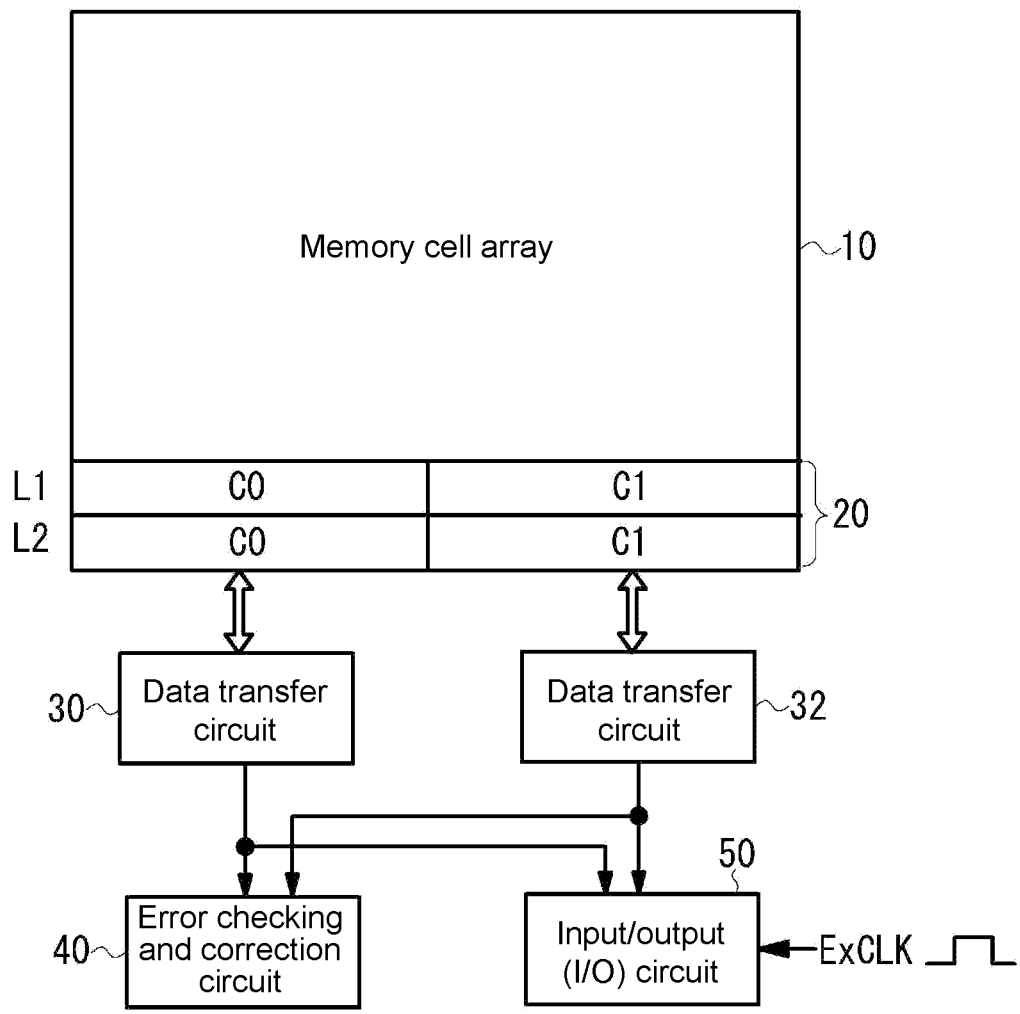
FIG. 1 is a schematic structural diagram of an existing NAND flash memory.
Figure 2:
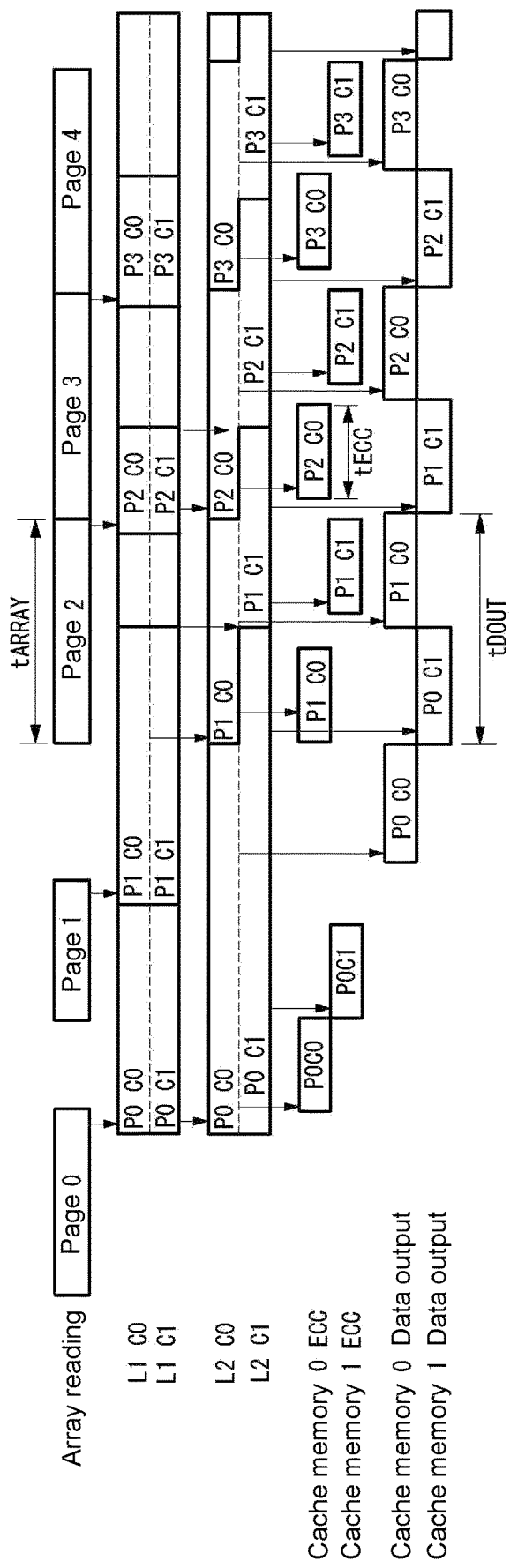
FIG. 2 is a timing diagram of continuous reading of pages performed in a conventional NAND flash memory.
Figure 3A:
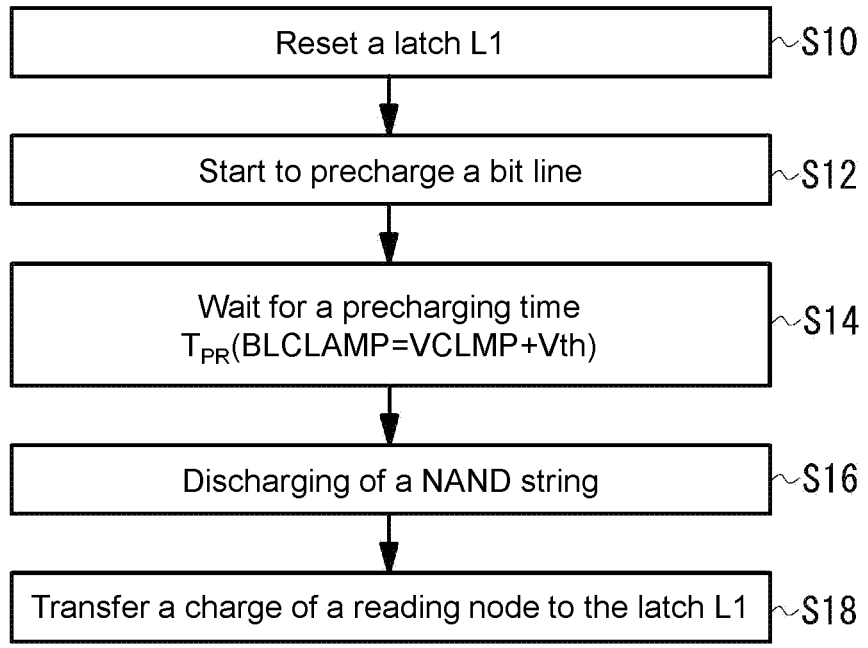
FIG. 3A and FIG. 3B is operation flows of a reading operation of a NAND flash memory.
Figure 3B:
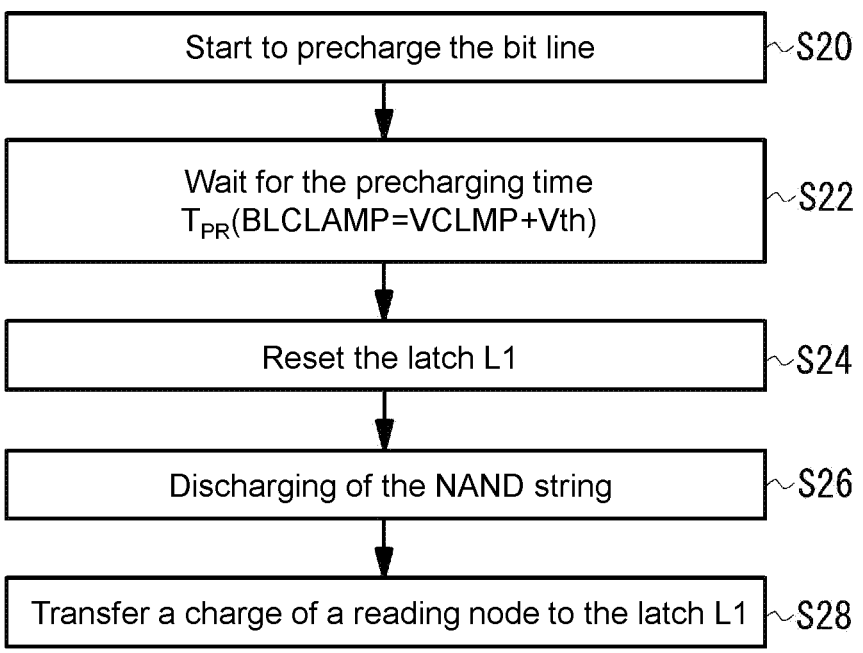
Figure 4A:
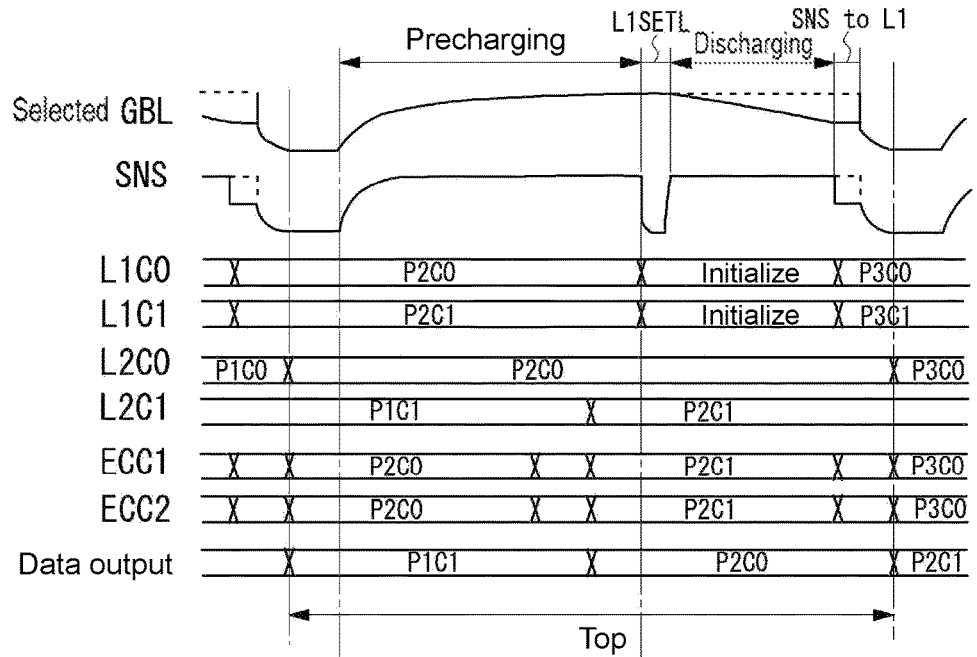
FIG. 4A is a timing diagram of continuous reading at a high frequency.

Then, after continuously supplying the voltage VCLMP1 to the selected bit line for a certain period of time, the controller 150 determines whether or not the latch L1 may be reset (S120). The certain period of time is slightly less than a precharging time $T_{PR\_NORMAL}$, where in the precharging time $T_{PR\_NORMAL}$, an optimal precharging voltage $V_{PR\_NORMAL}$ designed in the bit line (referring to FIG. 4A, FIG. 4B), FIG. 5A, FIG. 5B) is generated. In an embodiment, the certain period of time is determined based on a time $T_{RST}$ required to determine whether the latch L1 may be initialized. Namely, the certain period of time is $T_{PR\_NORMAL}-T_{RST}$, so that when the latch L1 may be reset after the certain period of time has elapsed, the precharging time becomes the optimal precharging time $T_{PR\_NORMAL}$, and the optimal precharging time $T_{PR\_NORMAL}$ is generated on the bit line. For example, when the optimal precharging time $T_{PR\_NORMAL}$ is about 6 µs, the time $T_{RST}$ required to determine whether the latch L1 may be initialized is about 0.2 µs, and the certain period of time is about 5.8 µs. The controller 150 may measure the certain period of time by counting, for example, an internal clock signal used to control a timing of the reading operation.

The method for determining whether the latch L1 may be reset is not particularly limited. For example, when the transistor CACHE used for transferring data of the latch L1 to the latch L2 is turned on, it is determined that the latch L1 may be reset, or it is determined that the latch L1 may be reset with reference to an indicator indicating that data transfer from the latch L1 to the latch L2 is performed. Through the above determination, the latch L1 is initialized before the data stored in the latch L1 is transferred to the latch L2, thereby preventing occurrence of data damage.

When it is determined that the reset of the latch L1 cannot be performed, i.e., when it is determined that the precharging time of the bit line exceeds the optimal precharging time $T_{PR\_NORMAL}$ (S120), the controller 150 decreases a gate voltage of the transistor BLCLAMP to VCLMP1+Vth−α (S130). Thereby, the voltage of VCLMP1−α is supplied to the bit line to suppress an increase of the precharging voltage of the bit line. If α is too small, the precharging voltage of the bit line increases, and if α is too large, the precharging voltage of the bit line decreases, or the bit line gets into a floating state. Therefore, a magnitude of α is set as that the precharging voltage generated in the bit line through supplying of the voltage VCLMP1 is still limited within a certain range even if the optimal precharging time $T_{PR\_NORMAL}$ is exceeded.

Figure 10:
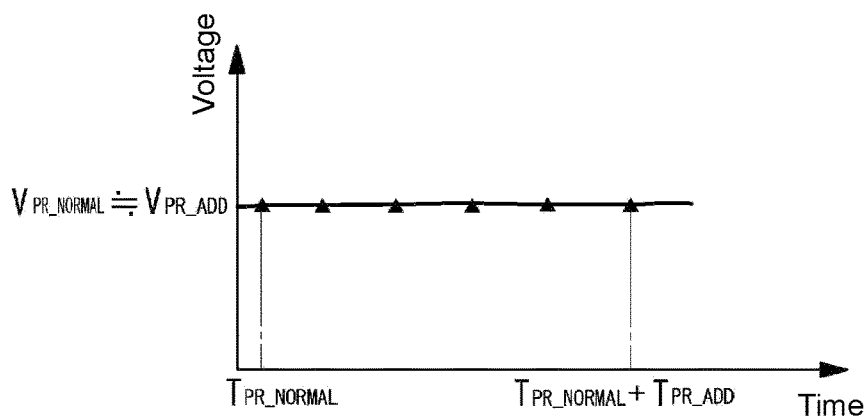
FIG. 10 is a transition waveform of a precharging voltage according to an embodiment of the invention.

FIG. 10 shows transition of the precharging voltage when the optimal α is set. α is set in a manner that the precharging voltage VPR_ADD obtained in the precharging time $T_{PR\_NORMAL}+T_{PR\_ADD}$ that exceeds the optimal precharging time $T_{PR\_NORMAL}$ used for obtaining the optimal precharging voltage $V_{PR\_NORMAL}$ becomes approximately constant, i.e., as $|V_{PR\_NORMAL}-V_{PR\_ADD}|<$a certain range. More preferably, $V_{PR\_NORMAL} \approx V_{PR\_ADD}$.

In addition, the precharging voltage of the bit line also depends on an operating temperature of the flash memory 100. When the operating temperature is high, compared to a low operating temperature, the increase of the precharging voltage of the bit line becomes larger, so that α is expected to be larger at high temperature than in the situation of low temperature, and the gate voltage of the transistor BLCLAMP is further decreased. In an embodiment, the flash memory 100 is equipped with a temperature sensor, and the controller 150 may select α1 when a detected temperature of the temperature sensor exceeds a threshold value, and select α2 when the detected temperature of the temperature sensor is below the threshold value (α1>α2), and the gate voltage of the transistor BLCLAMP is changed according to the operating temperature. For example, α1 and α2 may be held in a fuse memory that stores operating conditions, etc.

The controller 150 waits for a certain period of time after reducing the gate voltage of the transistor BLCLAMP to VCLMP1+Vth−α (S140), and determines again whether the latch L1 may be reset (S120). The loop continues until it is determined that the latch L1 may be reset, and during this period, the precharging voltage of the bit line is substantially maintained to a constant level. When it is determined that the latch L1 may be reset, the controller 150 makes the transistor BLSe to be not turned on to separate the selected bit line from the node BLS, and resets the latch L1 after completing the precharging of the selected bit line (S150). The reset of the latch L1 is performed by setting the node SLR1 to an L level (GND), and detailed operations thereof will be described later.

After the reset of the latch L1, the controller 150 discharges the NAND string (S160) to sense data of the selected memory cell. Namely, the source line side selection transistor is turned on to connect the NAND string to the source line, so as to apply a reading voltage to the word line of the selected memory cell, and apply a reading pass voltage to the word line of the unselected memory cells. Meanwhile, for sensing, the gate voltage of the transistor BLCLAMP is set to VCLMP2+Vth, and VCLMP2 is set to the reading voltage (in a relationship of VCLMP1>VCLMP2). After a discharge time has elapsed, the transistor BLPRE is not turned on, the transistor BLSe and the transistor BLCN are turned on, such that the source line side selection transistor is not turned on. Accordingly, in case that the selected memory cell is turned on, the charge of the selected bit line is discharged to the source line, and the reading node SNS maintains a voltage less than the reading voltage VCLMP2. On the other hand, in case that the selected memory cell is not turned on, the charge of the bit line hardly changes and maintains a voltage higher than the reading voltage VCLMP2, so that VDD is maintained at the reading node SNS.

Figure 4B:
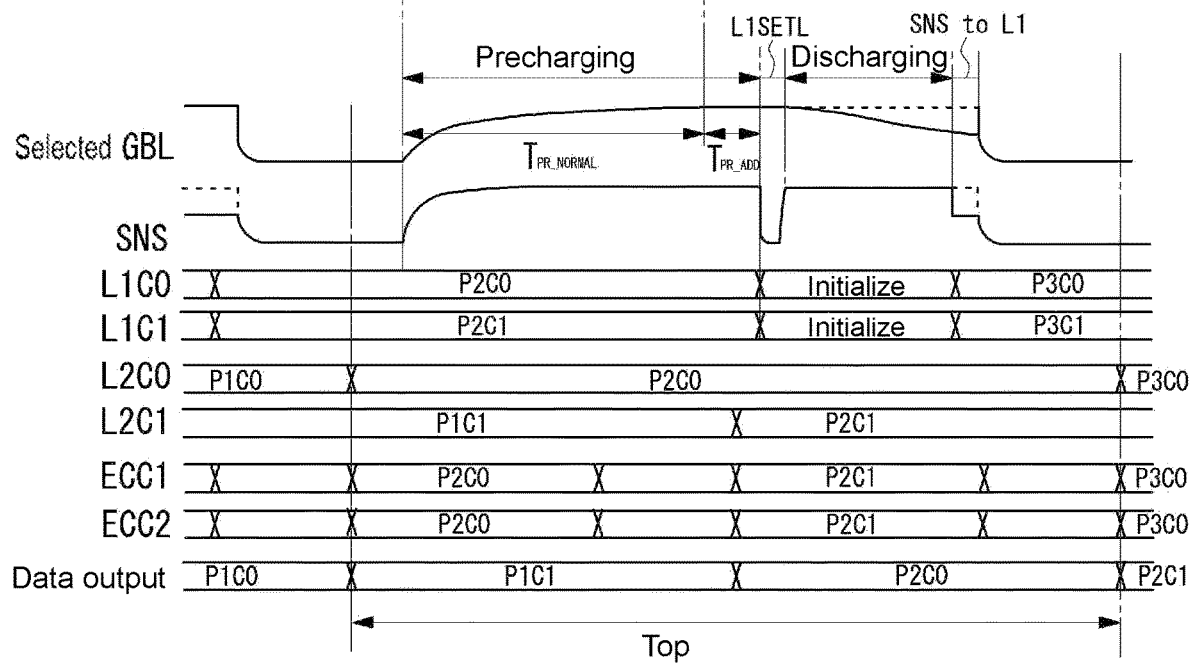
FIG. 4B is a timing diagram of continuous reading at a low frequency.
Figure 5A:
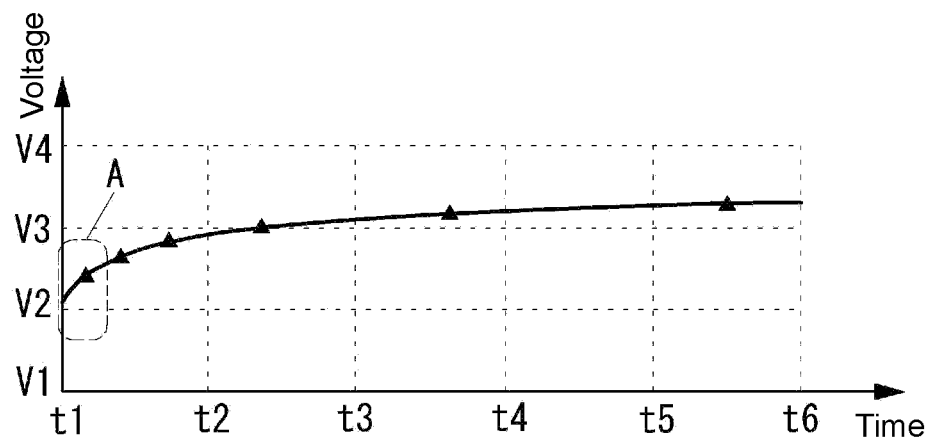
FIG. 5A and FIG. 5B are examples of waveform transition of a precharging voltage.
Figure 5B:
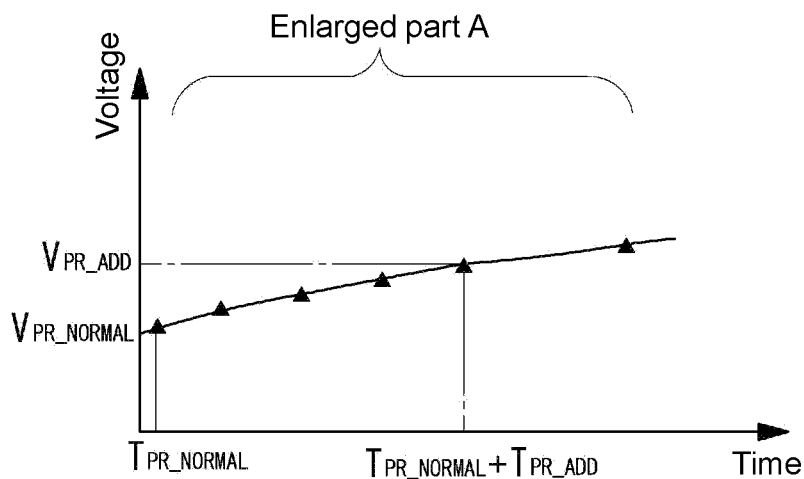

As shown in FIG. 4B, in the case of continuous reading by using the external clock signal ExCLK of a low frequency, even if the optimal precharging time $T_{PR\_NORMAL}$ is exceeded, the precharging voltage $V_{PR\_ADD}$ of the selected bit line is also substantially equal to the optimal precharging voltage $V_{PR\_NORMAL}$, so that the potential of the selected bit line may be sufficiently lowered to a voltage less than VCLMP2 when the charge of the selected bit line is discharged.

Then, the controller 150 turns on the transistor BLCD1 and transfers the charge of the reading node SNS to the node SLR1 of the latch L1 (S170). If the transferred charge is greater than or equal to the threshold value, the latch L1 is determined as data "1", and if the transferred charge is less than the threshold value, the latch L1 is determined as data "0" and holds the data. Even when the precharging time of the bit line is prolonged, the reading node SNS maintains an accurate charge, and the latch L1 may accurately determine the data of the selected memory cell.

Figure 11:
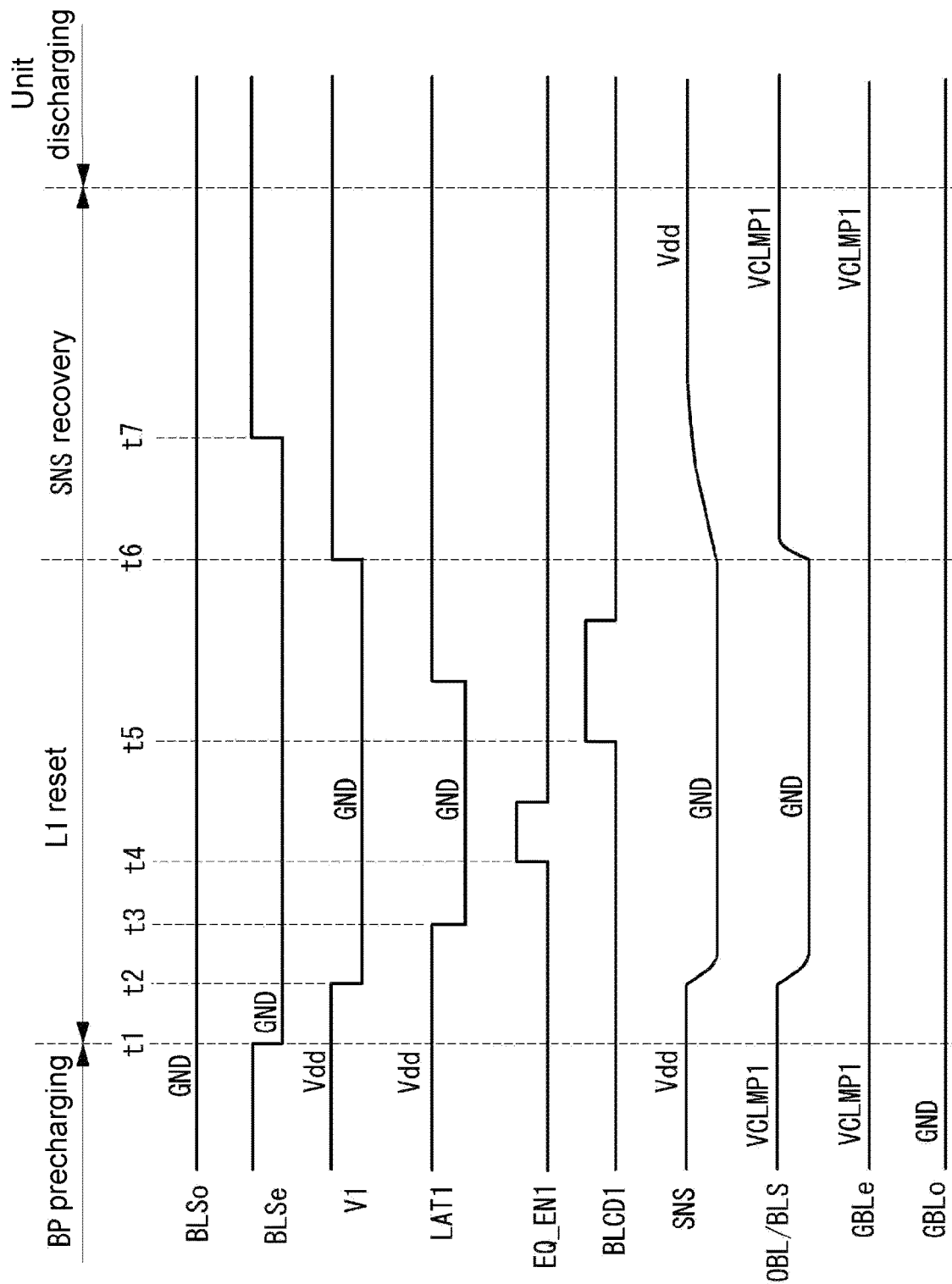
FIG. 11 is a timing diagram of a reset operation of a latch circuit in a flash memory according to an embodiment of the invention.

Then, the reset operation of the latch L1 after precharging of the bit line is described with reference to a timing diagram of FIG. 11. After the precharging of the bit line, the latch L1 is reset. During a reset period, the transistor BLPRE, the transistor BLCN, and the transistor BLCLAMP are turned on. At time t1, the transistor BLSe is not turned on, and the even bit line GBLe is electrically separated from the page buffer/reading circuit 170. Then, at time t2, the voltage supply node V1 is changed to GND. As a result, the reading node SNS falls from the supply voltage Vdd to the GND level, and the node TOBL and the node BLS fall from the clamping voltage VCLMP1 to the GND level.

Then, at time t3, a latch enable signal LAT1 for resetting the latch L1 is changed from an H level to the L level, and the latch L1 is in a resettable state. Then, at time t4, after the transistor EQ is turned on for a certain period of time to short-circuit the nodes SLR1 and SLS1 at a same potential, at time t5, the transistor BLCD1 is turned on for a certain period of time. In this way, the charge of the node SLR1 is discharged to the GND of the voltage supply node V1 via the reading node SNS, and reset of the latch L1 is completed.

After the reset of the latch L1 is completed, recovering of the reading node SNS, etc., is performed. Namely, the reading node SNS, the node TOBL, and the node BLS are recharged, and the voltages of these nodes are returned to a precharging state before the reset of the latch L1. At time t6, the voltage of the voltage supply node V1 is changed from GND to the supply voltage Vdd. In this way, the reading node SNS is recharged to Vdd, and the node TOBL and the node BLS are recharged to the clamping voltage VCLMP1. Then, at time t7, the transistor BLSe is turned on, and the even bit line GBLe is electrically connected to the page buffer/reading circuit 170. After the reset of the latch L1 is completed, the NAND string is discharged.

Then, other embodiments of the invention are described. In the above-mentioned embodiment, the precharging operation at the time of continuous reading when the latch L1 is reset after the precharging of the bit line is described, but the invention may also be applied to the precharging operation of general page reading. For example, when the precharging voltage of the bit line is measured in operation analysis of the flash memory, if a reading sequence is temporarily stopped, in the conduction state of the transistor BLCLAMP, the precharging time of the bit line exceeds the optimal precharging time $T_{PR\_NORMAL}$.

When the precharging time $T_{PR\_NORMAL}$ is exceeded, as that in the previous embodiment, the controller 150 lowers the gate voltage of the transistor BLCLAMP from VCLMP1+Vth to VCLMP1+Vth−α, so as to prevent the precharging voltage of the bit line from rising from the optimal precharging voltage $V_{PR\_NORMAL}$. In this way, a difference between the measured precharging voltage and the actual precharging voltage is substantially not generated, and the accurate operation analysis may be performed.

Although the preferred embodiments of the invention have been described in detail, the invention is not limited to the specific embodiments, and various modifications and changes may be made within the scope of the spirit of the invention described in the claims.

What is claimed is:

1. A continuous reading method for NAND flash memory, comprising:
    applying a first voltage to a gate of a transistor connected to a bit line, and supplying a voltage to the bit line via the transistor to start precharging of the bit line; and
    applying a second voltage lower than the first voltage to the gate of the transistor when a precharging time caused by the application of the first voltage has elapsed for a certain period of time, wherein the step of applying the second voltage comprises applying the second voltage until a latch circuit is able to be initialized when the latch circuit receiving a charge of a reading node is unable to be initialized, wherein the certain period of time is determined based on time required to determine whether the latch circuit is able to be initialized.

2. The continuous reading method as claimed in claim 1, wherein the second voltage is a voltage level that limits a voltage precharged to the bit line to a certain range.

3. The continuous reading method as claimed in claim 1, wherein the second voltage is a voltage level that prevents the precharged bit line from becoming a floating state.

4. The continuous reading method as claimed in claim 1, wherein the certain period of time is less than the precharging time, and an optimal precharging voltage designed in the bit line is generated through supplying the first voltage during the precharging time.

5. The continuous reading method as claimed in claim 1, further comprising a step of initializing a latch circuit after precharging the bit line.

6. The continuous reading method as claimed in claim 5, wherein each of the steps is carried out in continuous reading of pages, and the continuous reading of pages comprises:
    holding data read from a selected page of a memory cell array in the latch circuit, and holding data read from a next selected page in the latch circuit after transferring the data held in the latch circuit to other latch circuits;
        continuously outputting the data held in the other latch circuits to the outside in synchronization with an external clock signal; and
        performing error checking and correction on the data held in the other latch circuits.

7. A semiconductor device, comprising:
    a NAND memory cell array;
    a reading unit, reading data from a selected page of the memory cell array; and
    an output unit, outputting the data read out by the reading unit to the outside,
    wherein the reading unit comprises a page buffer/reading circuit connected to the memory cell array via a bit line,
    the page buffer/reading circuit comprises a transistor for supplying a precharging voltage to the bit line, and
    when precharging the bit line, the page buffer/reading circuit applies a first voltage to a gate of the transistor to start to precharge, and applies a second voltage less than the first voltage to the gate of the transistor when a precharging time has elapsed for a certain period of time, wherein the page buffer/reading circuit applies the second voltage when a latch circuit receiving a charge of a reading node is unable to be initialized, the applying the second voltage continues until the latch circuit is able to be initialized, and the certain period of time is determined based on time required to determine whether the latch circuit is able to be initialized.

8. The semiconductor device as claimed in claim 7, wherein the second voltage is a voltage level that limits a voltage precharged to the bit line to a certain range.

9. The semiconductor device as claimed in claim 7, wherein the second voltage is a voltage level that prevents the precharged bit line from becoming a floating state.

10. The semiconductor device as claimed in claim 7, wherein the certain period of time is less than the precharging time, and an optimal precharging voltage designed in the bit line is generated through supplying the first voltage during the precharging time.

11. The semiconductor device as claimed in claim 7, wherein the reading unit further initializes the latch circuit after precharging the bit line.

12. The semiconductor device as claimed in claim 7, wherein the page buffer/reading circuit further comprises other latch circuits that receive data held in the latch circuit, and
    when the reading unit performs continuous reading, the latch circuit holds data read from a next selected page of the memory cell array during a period when the data of the other latch circuits is output.

13. The semiconductor device as claimed in claim 7, wherein the reading unit performs continuous reading of pages.

14. The semiconductor device as claimed in claim 13, wherein the semiconductor device further comprises an error checking and correction circuit that performs error checking and correction of data, and
    when the reading unit performs continuous reading, during a period when the data held in a first part of the other latch circuits is subjected to an error checking and correction process performed by the error checking and correction circuit, the data undergoing the error checking and correction process and held in a second part of the other latch circuits is output.

* * * * *